(12) United States Patent
Papa et al.

(10) Patent No.: US 8,141,017 B2
(45) Date of Patent: Mar. 20, 2012

(54) METHOD FOR BOUNDED TRANSACTIONAL TIMING ANALYSIS

(75) Inventors: David Papa, Austin, TX (US); Michael D. Moffitt, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 499 days.

(21) Appl. No.: 12/237,482

(22) Filed: Sep. 25, 2008

(65) Prior Publication Data

US 2010/0077368 A1 Mar. 25, 2010

(51) Int. Cl.
*G06F 17/50* (2006.01)
(52) U.S. Cl. ...................................................... 716/113
(58) Field of Classification Search .................. 716/1, 6, 716/100, 113
See application file for complete search history.

(56) References Cited

U.S. PATENT DOCUMENTS

| | | | | |
|---|---|---|---|---|
| 7,823,017 | B2 * | 10/2010 | Bueti et al. | 714/30 |
| 7,840,925 | B1 * | 11/2010 | Lujan et al. | 716/123 |
| 2008/0209376 | A1 * | 8/2008 | Kazda et al. | 716/6 |
| 2008/0215923 | A1 * | 9/2008 | Bueti et al. | 714/39 |
| 2010/0218152 | A1 * | 8/2010 | Tehrani et al. | 716/6 |

* cited by examiner

*Primary Examiner* — Suchin Parihar
(74) *Attorney, Agent, or Firm* — Suiter Swantz pc llo

(57) ABSTRACT

A portion of a gate-level netlist representing an integrated circuit design is selected for optimization. A timing window representing the selected portion is made comprising one or more copies of the selected portion. A checkpoint is created for the timing window and stored in a transaction history. One or more changes are then made to the timing window and stored in the transaction history. The changed elements are marked as dirty and stored in the transaction history. After the one or more changes have been made, the timing window is queried for current timing conditions and compared with the checkpoint. If the one or more changes are an improvement, the one or more changes are committed by replicating the one or more changes to the portion of the gate-level netlist. If the one or more changes are not an improvement, the timing window may be restored to the checkpoint.

17 Claims, 16 Drawing Sheets

METHOD FOR BOUNDED TRANSACTIONAL TIMING ANALYSIS

TECHNICAL FIELD

The present disclosure generally relates to the field of integrated circuit design tools and more particularly to integrated circuit physical synthesis tools.

BACKGROUND

In a design flow, a concept for an integrated circuit design is transformed into its final form. Physical synthesis is a stage in the design flow of an integrated circuit where a gate-level netlist representing the integrated circuit design is utilized to optimize the physical characteristics of the integrated circuit design. These characteristics may include timing, power, testability, signal integrity, routability, and manufacturability. The physical characteristics of the integrated circuit design may be optimized subject to assigning the gates in the netlist to non-overlapping locations in the integrated circuit design.

Large-scale industrial static timing analysis (STA) engines are the backbone for modern physical synthesis flows. STA engines typically maintain fault-tolerant graph-based structures in order to provide a global interface for components to query current timing conditions (e.g., to extract the critical paths of a network) and update the values of edges between existing nodes in the graph (e.g., to reflect the re-powering or replacing of logical gates). STA engines are also responsible for propagating timing information throughout the entire network.

SUMMARY

A portion of a gate-level netlist representing an integrated circuit design may be selected for optimization. A change may be made during physical synthesis to a timing window representing the portion of the gate-level netlist representing the integrated circuit design. Current timing conditions of the timing window representing the portion of a gate-level netlist representing an integrated circuit design may be queried and the values of edges between existing nodes in a timing graph updated. The computational expense of querying timing conditions of the timing window representing the portion of a gate-level netlist representing an integrated circuit design and updating the values of edges between existing nodes in the timing graph may be proportional to the size of the portion of a gate-level netlist representing an integrated circuit design rather than the entire gate-level netlist representing an integrated circuit design. Thus, less computation is required to query the timing window representing the portion of the gate-level netlist representing the integrated circuit design for current timing conditions and update the values of edges between existing nodes in the graph than the query the entire gate-level netlist representing the integrated circuit design utilizing the same method of querying current timing conditions and updating the values of edges between existing nodes in the graph, resulting in more efficient physical synthesis.

The timing window may comprise a copy made of the portion of the gate-level netlist representing the integrated circuit design which has been selected for optimization. Before one or more changes are made to the copy of the portion of the gate-level netlist representing the integrated circuit design, a checkpoint may be created. The checkpoint may be stored in a transaction history. As part of creating the checkpoint, the copy of the portion of the gate-level netlist representing the integrated circuit design may be queried for current timing conditions and the values of edges between existing nodes in the timing graph may be determined. The timing graph may be stored in the transaction history. One or more changes may then be made to the copy of the portion of the gate-level netlist representing the integrated circuit design. The one or more changes may be stored in the transaction history. The changed elements of the copy of the portion of the gate-level netlist representing the integrated circuit design may be marked as dirty (i.e. indicated that those elements have been changed). The elements that have been marked dirty may be stored in the transaction history. After the one or more changes have been made to the copy of the portion of the gate-level netlist representing the integrated circuit design, the copy of the portion of the gate-level netlist representing the integrated circuit design may be queried for current timing conditions and the values of edges between existing nodes in the timing graph may be updated. The timing conditions and values of edges between existing nodes in the timing graph after the change may be compared with the timing conditions and the values of edges between existing nodes in the timing graph stored in the transaction history from prior to the change. It may be determined, based on the comparison, whether the one or more changes are an improvement.

If the one or more changes are an improvement, the one or more changes to the copy of the portion of the gate-level netlist representing the integrated circuit design may be committed by replicating the one or more changes to the portion of the gate-level netlist representing the integrated circuit design utilizing the one or more changes stored in the transaction history and/or the one or more dirty elements of the copy of the portion of the gate-level netlist representing the integrated circuit design stored in the transaction history. After the one or more changes to the copy of the portion of the gate-level netlist representing the integrated circuit design are committed, the one or more dirty elements of the copy of the portion of the gate-level netlist representing the integrated circuit design may then be marked as clean (i.e. unchanged) and the checkpoint, the timing graph, the one or more changes, and/or the elements that have been marked dirty may be deleted (i.e. removed) from the transaction history.

If the one or more changes are not an improvement, the copy of the portion of the gate-level netlist representing the integrated circuit design may be restored (i.e. rolled back) to the checkpoint stored in the transaction history by undoing the one or more changes and by setting the timing conditions and values of edges between existing nodes in the timing graph to the timing conditions and values of edges between existing nodes in the timing graph previous to the one or more changes. The one or more changes may be undone utilizing the one or more changes stored in the transaction history and/or the one or more dirty elements of the copy of the portion of the gate-level netlist representing the integrated circuit design stored in the transaction history. The timing conditions and values of edges between existing nodes in the timing graph may be set to the timing conditions and values of edges between existing nodes in the timing graph previous to the one or more changes utilizing the timing graph may be stored in the transaction history. After the copy of the portion of the gate-level netlist representing the integrated circuit design is restored to the checkpoint stored in the transaction history, the one or more dirty elements of the copy of the portion of the gate-level netlist representing the integrated circuit design may then be marked as clean (i.e. unchanged) and the checkpoint, the timing graph, the one or more changes, and/or the elements that have been marked dirty may be deleted (i.e. removed) from the transaction history.

Although the present disclosure has been described utilizing a single checkpoint, it should be understood that multiple checkpoints may be created and stored in the transaction history without departing from the scope of the present disclosure. In such a case, the copy of the portion of the gate-level netlist representing the integrated circuit design may be restored to any of the checkpoints that have created and stored in the transaction history, not just a checkpoint created and stored in the transaction history immediately prior to one or more changes being made to the copy of the portion of the gate-level netlist representing the integrated circuit design.

Although the present disclosure has been described utilizing one copy of the portion of the gate-level netlist representing the integrated circuit design, it should be understood that multiple copies may be made and changes may be made to the multiple copies and evaluated in parallel. In this way, multiple optimization possibilities for the portion of the gate-level netlist representing the integrated circuit design may be concurrently explored.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Propagation of timing information by STA engines throughout the entire network is typically deferred until absolutely necessary due to the computational expense. STA may be incremental, as the majority of atomic changes made during synthesis affect only a local portion of the timing graph. However, the level of support required to ensure true incrementality increases as the sophistication of physical synthesis tools increase. For example, "self-aware" transforms may be capable of detecting when predicted improvements result in unexpected degradations. It is inefficient if these transforms attempt extremely poor choices and propagate these values beyond a local frontier where they will be ultimately rejected. When these transforms detect that a predicted improvement does result in an unexpected degradation, the state must be restored to the previously observed values.

STA engines may invalidate the entire fan-in (the portion of the integrated circuit design leading to the changed portion) and fan-out cone (the portion of the integrated circuit design leading from the changed portion) of any change to the logical or physical implementation of the integrated circuit design. As a result, current timing conditions may need to be queried and the values of edges between existing nodes in the graph may need to be updated. This situation is inefficient, as only timing nearby a change may need to be queried to determine whether a change is an improvement and only a bounded region of the fan-in and fan-out may need to be invalidated. If the change is undone, the undoing of the change may simply be treated as a second change, and the entire fan-in and fan-out cones may again be invalidated. Current timing conditions may again need to be queried and the values of edges between existing nodes in the graph may again need to be updated. This is also inefficient, as already known values may need to be re-computed.

Figure 1:
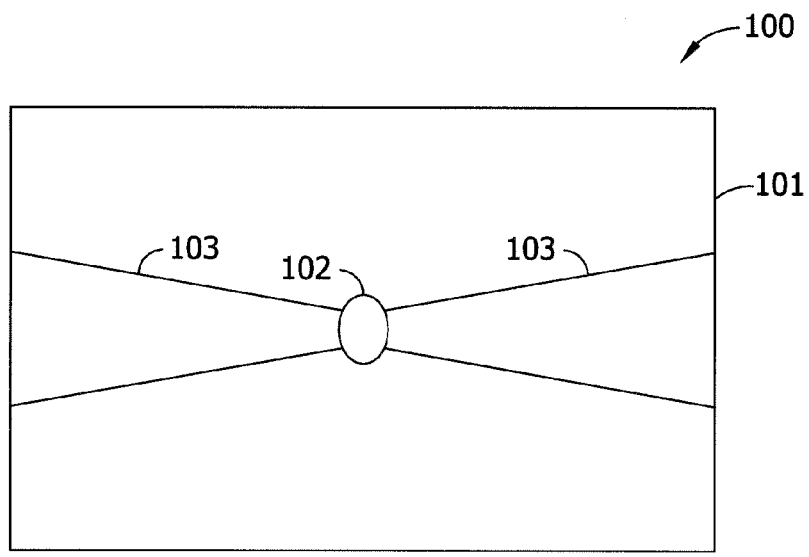
FIG. 1 is a diagram view illustrating a graphical representation of physical synthesis of an integrated circuit design represented by a gate-level netlist.

FIG. 1 illustrates a graphical representation of physical synthesis 100 of an integrated circuit design 101 represented by a gate-level netlist. Change 102 represents a change made during physical synthesis to the gate-level netlist representing the integrated circuit design 101. Timing cones 103 represent the fan-in and fan-out of the change made during the physical synthesis to the gate-level netlist representing the integrated circuit design 101. Timing cones 103 illustrate the subdivision of the gate-level netlist of the integrated circuit design 101 that may need to be queried for current timing conditions and the values of edges between existing nodes in the graph updated.

Figure 2:
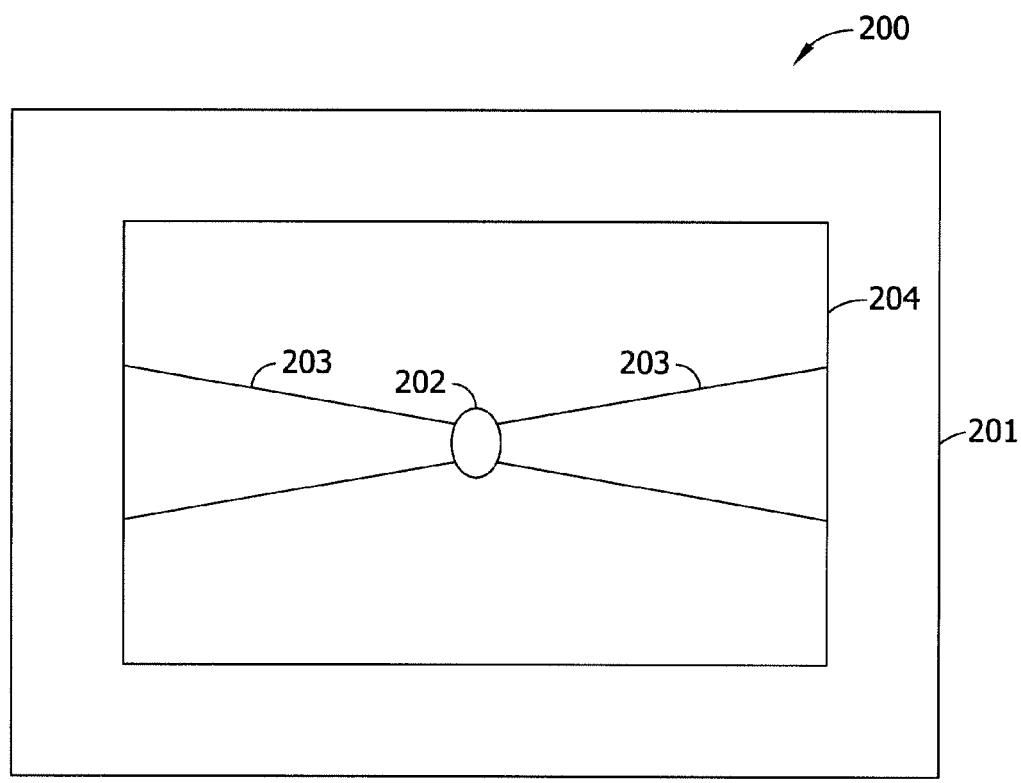
FIG. 2 is a diagram view illustrating a graphical representation of physical synthesis of an integrated circuit design represented by a gate-level netlist, in accordance with an embodiment of the present disclosure.

FIG. 2 illustrates a graphical representation of physical synthesis 200 of an integrated circuit design 201 represented by a gate-level netlist, in accordance with an embodiment of the present disclosure. Timing window 204 represents a portion of the gate-level netlist representing the integrated circuit design 201 which has been selected for optimization. The portion represented by timing window 204 may be selected from the gate-level netlist representing design 201 for optimization based on a variety of criteria including, but not limited to, the portion of the gate-level netlist representing design 201 that may require optimization, the portion of the gate-level netlist representing design 201 that may be necessary to determine whether a change to the gate-level netlist should be rejected, and/or the portion of the gate-level netlist representing design 201 that may be affected by a change to the gate-level netlist. Change 202 represents a change made during physical synthesis to the timing window 204 representing the portion of the gate-level netlist representing the integrated circuit design 201. Timing cones 203 represent the fan-in and fan-out of the change made during the physical synthesis to the timing window 204 representing the portion of the gate-level netlist representing the integrated circuit design 201. Timing cones 203 illustrate the subdivision of timing window 204 representing the portion of the gate-level netlist of the integrated circuit design 201 that may need to be queried for current timing conditions and the values of edges between existing nodes in the graph updated. It can be seen by comparing FIGS. 1 and 2 that timing cones 203 occupy a smaller subdivision of the gate-level netlist of the integrated circuit design 201 than timing cones 103 occupy of the gate-level netlist of the integrated circuit design 101. As such, less computation is required to query for current timing conditions and update the values of edges between existing nodes in the graph for change 202 than change 102 utilizing the same method of querying current timing conditions and updating the values of edges between existing nodes in the graph. The computational expense of query for current timing conditions and update the values of edges between existing nodes in the graph for change 202 may be proportional to the size of timing window 204 rather than the entire gate-level netlist representing the integrated circuit design 201. Thus, the efficiency of the physical synthesis 200 of the integrated circuit design 201 is improved over the efficiency of the physical synthesis 100 of the integrated circuit design 101.

The timing window 204 may comprise a copy made of the portion of the gate-level netlist representing the integrated circuit design 201 which has been selected for optimization. Before one or more changes are made to the copy of the portion of the gate-level netlist representing the integrated circuit design 201, a checkpoint may be created. The checkpoint may be stored in a transaction history. As part of creating the checkpoint, the copy of the portion of the gate-level netlist representing the integrated circuit design 201 may be queried for current timing conditions and the values of edges between existing nodes in the timing graph may be determined. The timing graph may be stored in the transaction history. The timing graph may be stored in a first-in-last-out (FIFO) data structure in the transaction history including, but not limited to, a stack. One or more changes may then be made to the copy of the portion of the gate-level netlist representing the integrated circuit design 201. The one or more changes may be stored in the transaction history. The changed elements of the copy of the portion of the gate-level netlist representing the integrated circuit design 201 may be marked as dirty (i.e. indicated that those elements have been changed). The elements that have been marked dirty may be stored in the transaction history.

After the one or more changes have been made to the copy of the portion of the gate-level netlist representing the integrated circuit design 201, the copy of the portion of the gate-level netlist representing the integrated circuit design 201 may be queried for current timing conditions and the values of edges between existing nodes in the timing graph may be updated. The timing conditions and values of edges between existing nodes in the timing graph after the change may be compared with the timing conditions and the values of edges between existing nodes in the timing graph stored in the transaction history from prior to the change. It may be determined, based on the comparison, whether the one or more changes are an improvement. The one or more changes may be an improvement if the timing conditions and values of edges between existing nodes in the timing graph subsequent to the one or more changes more closely conform to the timing constraints of the integrated circuit design 201 than the timing conditions and values of edges between existing nodes in the timing graph previous to the one or more changes. The one or more changes may not be an improvement if the timing conditions and values of edges between existing nodes in the timing graph subsequent to the one or more changes do not more closely conform to the timing constraints of the integrated circuit design 201 than the timing conditions and values of edges between existing nodes in the timing graph previous to the one or more changes.

If the one or more changes are an improvement, the one or more changes to the copy of the portion of the gate-level netlist representing the integrated circuit design 201 may be committed by replicating the one or more changes to the portion of the gate-level netlist representing the integrated circuit design 201. The one or more changes to the copy of the portion of the gate-level netlist representing the integrated circuit design 201 may be replicated to the portion of the gate-level netlist representing the integrated circuit design 201 utilizing the one or more changes stored in the transaction history and/or the one or more dirty elements of the copy of the portion of the gate-level netlist representing the integrated circuit design 201 stored in the transaction history. After the one or more changes to the copy of the portion of the gate-level netlist representing the integrated circuit design 201 are committed, the one or more dirty elements of the copy of the portion of the gate-level netlist representing the integrated circuit design 201 may then be marked as clean (i.e. unchanged) and the checkpoint, the timing graph, the one or more changes, and/or the elements that have been marked dirty may be deleted (i.e. removed) from the transaction history.

If the one or more changes are not an improvement, the copy of the portion of the gate-level netlist representing the integrated circuit design 201 may be restored (i.e. rolled back) to the checkpoint stored in the transaction history. The copy of the portion of the gate-level netlist representing the integrated circuit design 201 may be restored to the checkpoint stored in the transaction history by undoing the one or more changes and by setting the timing conditions and values of edges between existing nodes in the timing graph to the timing conditions and values of edges between existing nodes in the timing graph previous to the one or more changes. The one or more changes may be undone utilizing the one or more changes stored in the transaction history and/or the one or more dirty elements of the copy of the portion of the gate-level netlist representing the integrated circuit design 201 stored in the transaction history. Alternatively, the one or more changes may be undone by not committing to the copy of the portion of the gate-level netlist representing the integrated circuit design 201 (i.e. by not replicating the one or more changes to the portion of the gate-level netlist representing the integrated circuit design 201). The timing conditions and values of edges between existing nodes in the timing graph may be set to the timing conditions and values of edges between existing nodes in the timing graph previous to the one or more changes utilizing the timing graph may be stored in the transaction history. After the copy of the portion of the gate-level netlist representing the integrated circuit design 201 is restored to the checkpoint stored in the transaction history, the one or more dirty elements of the copy of the portion of the gate-level netlist representing the integrated circuit design 201 may then be marked as clean (i.e. unchanged) and the checkpoint, the timing graph, the one or more changes, and/or the elements that have been marked dirty may be deleted (i.e. removed) from the transaction history.

Although the present disclosure has been described utilizing a single checkpoint, it should be understood that multiple checkpoints may be created and stored in the transaction history without departing from the scope of the present disclosure. In such a case, the copy of the portion of the gate-level netlist representing the integrated circuit design 201 may be restored to any of the checkpoints that have created and stored in the transaction history, not just a checkpoint created and stored in the transaction history immediately prior to one or more changes being made to the copy of the portion of the gate-level netlist representing the integrated circuit design 201.

Although the present disclosure has been described utilizing one copy of the portion of the gate-level netlist representing the integrated circuit design 201 which has been selected for optimization, it should be understood that multiple copies may be made and changes may be made to the multiple copies and evaluated in parallel. In this way, multiple optimization possibilities for the portion of the gate-level netlist representing the integrated circuit design which has been selected for optimization may be concurrently explored.

Although the present disclosure has been described utilizing one or more copies of the portion of the gate-level netlist representing the integrated circuit design 201 which has been selected for optimization which are then changed and evaluated, it should be understood that the timing window 204 may comprise one or more memory structures that sequentially record changes as differences from the portion of the gate-level netlist representing the integrated circuit design 201 which has been selected for optimization without departing from the scope of the present disclosure. The one or more memory structures may comprise a difference stack. Each difference stack may then represent a series of differences from the portion of the gate-level netlist representing the integrated circuit design 201 which has been selected for optimization (and/or another difference stack) and may each be evaluated to see if the differences represented by the difference stack were an improvement.

The physical synthesis 200 of an integrated circuit design 201 represented by a gate-level netlist illustrated in FIG. 2 may be performed by computer readable instructions stored on a tangible computer usable medium and/or a tangible computer readable medium including, but not limited to, a tangible computer readable storage medium. The tangible computer readable storage medium may include, but is not limited to a hard disk drive, a solid state drive, an optical storage medium, a memory, a random access memory, a read only memory, a flash memory, a cache memory, an optical disk, a floppy disk, a universal serial bus drive, a register, paper tape, a punch card, a ram disk, a ZIP disk, magnetic tape, volatile memory, non-volatile memory, dynamic memory, static memory, dynamic random access memory, synchronous dynamic random access memory, and/or a tape cartridge.

Figure 3:
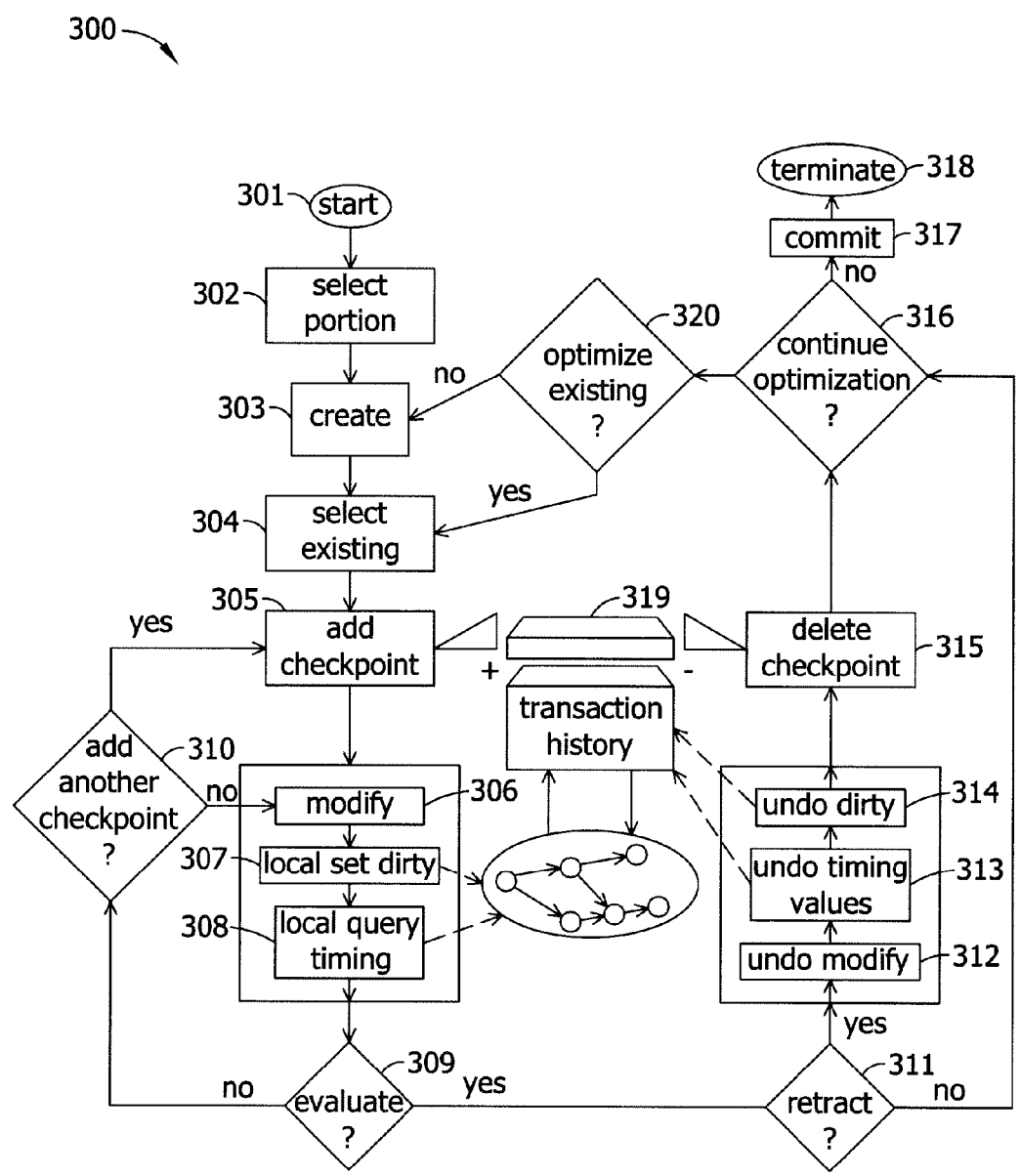
FIG. 3 is a flow chart illustrating an example of a flow of the process of the physical synthesis of FIG. 2, in accordance with an embodiment of the present disclosure.

FIG. 3 is a flow chart illustrating an example of a flow of the process of the physical synthesis 200 of FIG. 2, in accordance with an embodiment of the present disclosure. The process may begin at a start 301. After start 301, a portion of a gate-level netlist representing an integrated circuit design may be selected 302. Then, a copy of the portion of a gate-level netlist representing an integrated circuit design may be created 303. After the copy of the portion of a gate-level netlist representing an integrated circuit design has been created 303, an existing copy of the portion of the gate-level netlist representing an integrated circuit design may be selected 304 and a checkpoint may be created 305. The checkpoint may be stored to transaction history 319. After a checkpoint is created 305, the copy of the portion of the gate-level netlist representing the integrated circuit design may be modified 306 and the changed elements of the copy of the portion of the gate-level netlist representing the integrated circuit design may be marked as dirty 307. After the copy of the portion of the gate-level netlist representing the integrated circuit design is modified 306 and the changed elements of the copy of the portion of the gate-level netlist representing the integrated circuit design are marked as dirty 307, the timing of the copy of the portion of the gate-level netlist representing the integrated circuit design may be queried 308. Then, it may be determine whether to evaluate whether the modification is an improvement 309.

If it is not determined to evaluate whether the modification is an improvement 309, it may be determined whether to create a new checkpoint 310. If it is determined to create another checkpoint 310, a checkpoint may be created 305. If it is not determined to create another checkpoint 310, the copy of the portion of the gate-level netlist representing the integrated circuit design may be modified 306.

If it is determined to evaluate whether the modification is an improvement 309, it may be determined whether to retract the modification 311 by comparing the timing of the copy of the portion of the gate-level netlist representing the integrated circuit design with the checkpoint. If it is determined to retract the modification 311, the modification is undone 312. Then the timing values are undone 313, the elements of the copy of the portion of the gate-level netlist representing the integrated circuit design marked as dirty are changed to clean 314, and the checkpoint is deleted 315. The checkpoint may be deleted from transaction history 319. After the checkpoint is deleted 315, it may be determined whether to continue optimization 316. If it is determined to continue optimization 316, it may be determined whether to optimize an existing copy of the portion of the gate-level netlist representing an integrated circuit design 320. If it is not determined to optimize an existing copy of the portion of the gate-level netlist representing an integrated circuit design 320, a copy of the portion of a gate-level netlist representing an integrated circuit design may be created 303. If it is determined to optimize an existing copy of the portion of the gate-level netlist representing an integrated circuit design 320, an existing copy of the portion of the gate-level netlist representing an integrated circuit design may be selected 304 and a checkpoint may be created 305. Thus, multiple copies of the portion of the gate-level netlist representing an integrated circuit design may be changed and evaluated in parallel. If it is not determined to continue optimization 316, any modifications may be committed to the integrated circuit design 317. After any modifications have been committed to the integrated circuit design 317, the process may terminate 318. If it is not determined to evaluate whether the modification is an improvement 309, it may be determined whether to continue optimization 316.

FIGS. 4 through 8 are circuit diagrams 400 illustrating example changes that may be made to circuit 400 which represents portion 204 of FIG. 2 during physical synthesis 200, in accordance with an embodiment of the present disclosure. It should be noted that FIGS. 4 through 8 merely provide examples of changes and are in no way intended to restrict the changes that may be made to portion 204 of FIG. 2 during physical synthesis 200 of the integrated circuit design 201 represented by a gate-level netlist in accordance with the present disclosure.

Figure 4:
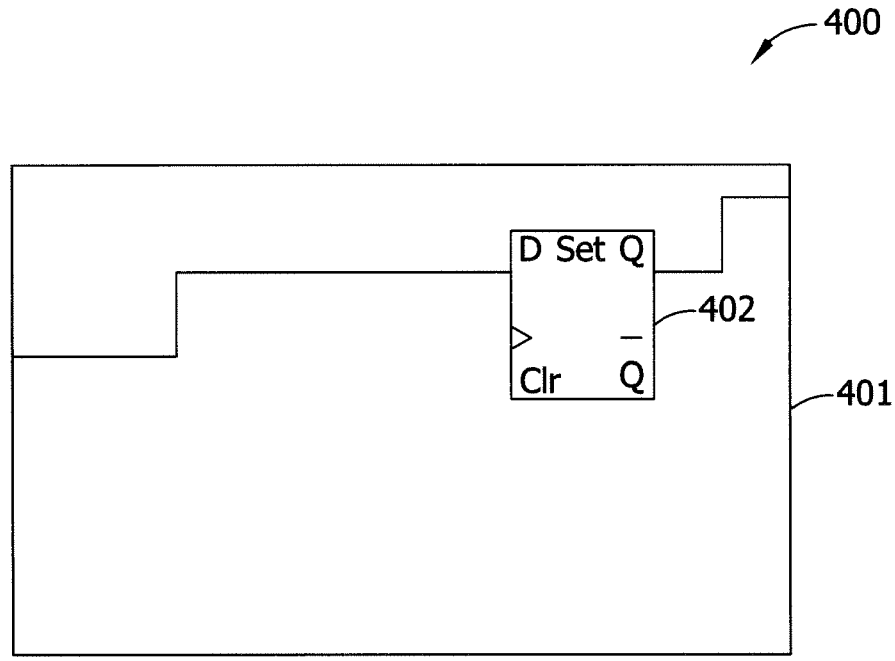
FIG. 4 is a circuit diagram illustrating a change that may be made to a circuit during the physical synthesis of FIG. 2, in accordance with an embodiment of the present disclosure.
Figure 5:
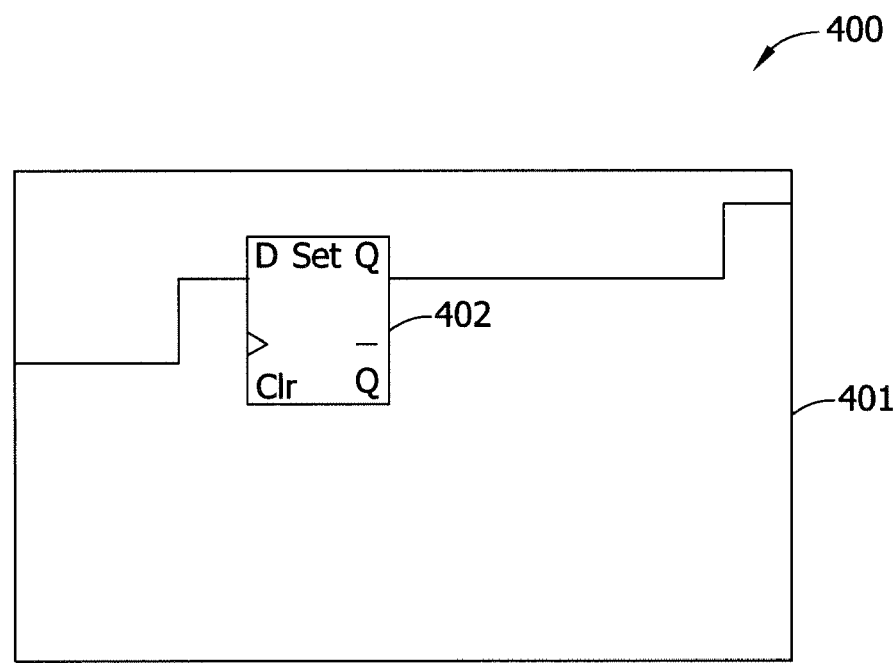
FIG. 5 is a circuit diagram illustrating a change that may be made to a circuit during the physical synthesis of FIG. 2, in accordance with an embodiment of the present disclosure.
Figure 6:
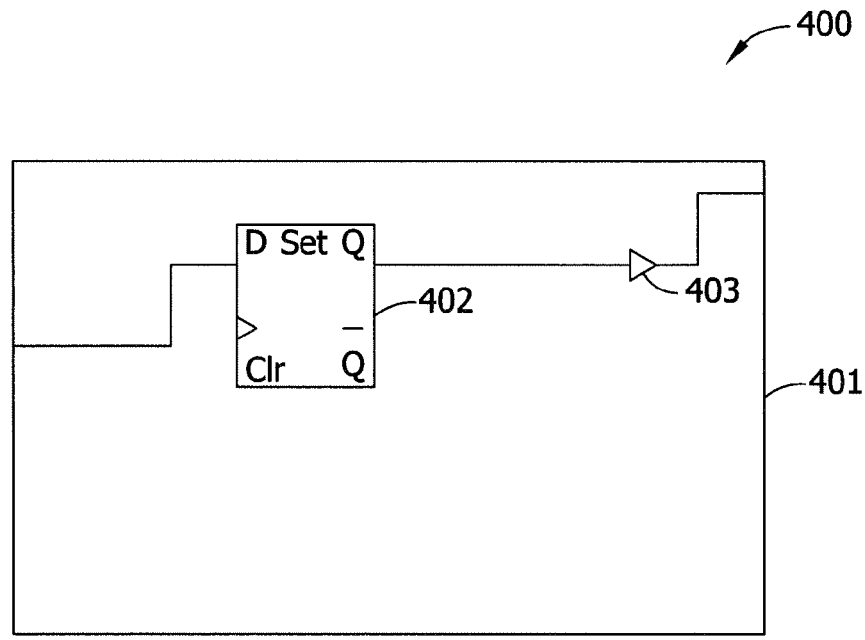
FIG. 6 is a circuit diagram illustrating a change that may be made to a circuit during the physical synthesis of FIG. 2, in accordance with an embodiment of the present disclosure.
Figure 7:
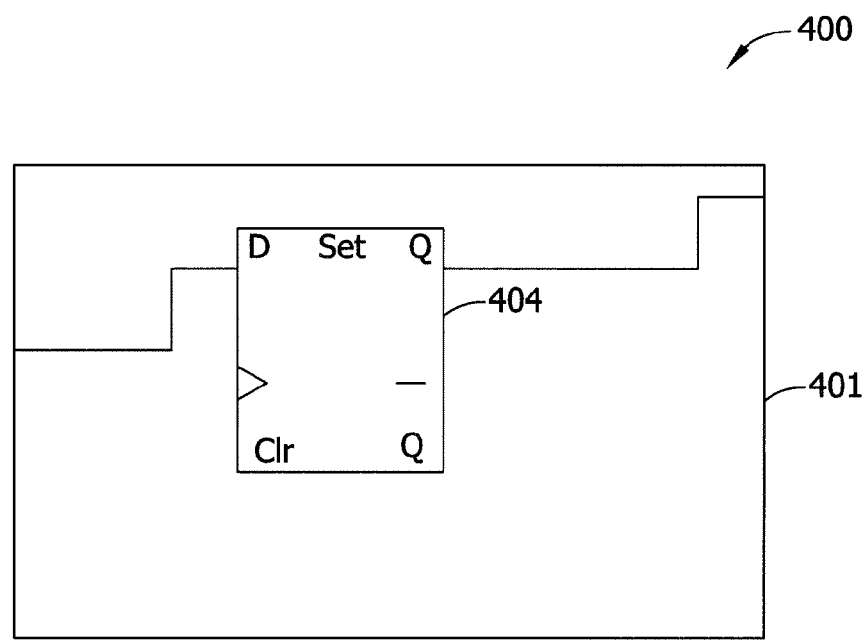
FIG. 7 is a circuit diagram illustrating a change that may be made to a circuit during the physical synthesis of FIG. 2, in accordance with an embodiment of the present disclosure.
Figure 8:
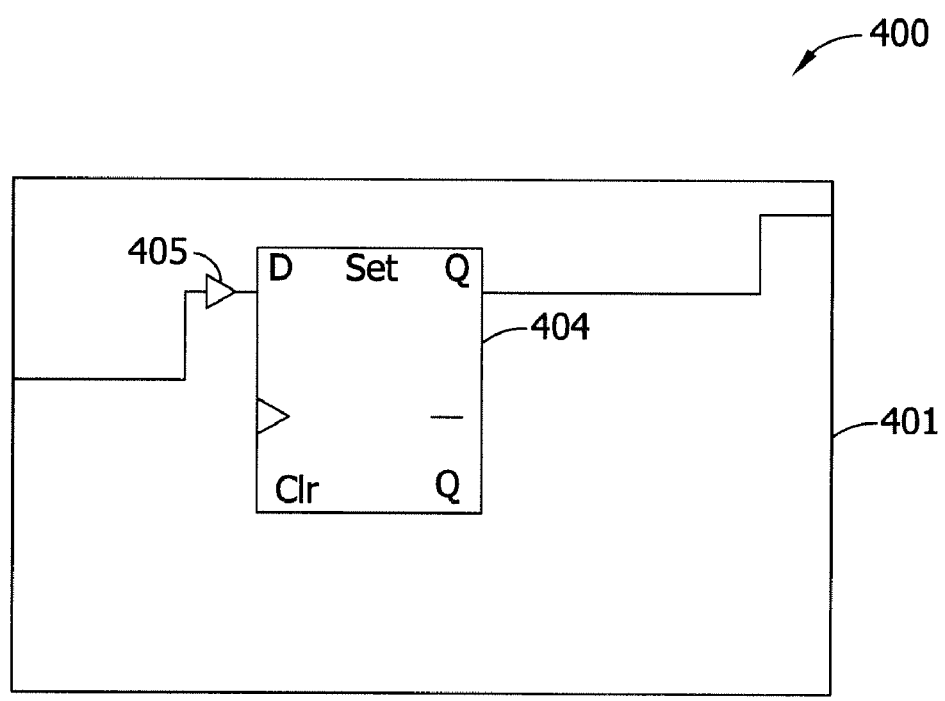
FIG. 8 is a circuit diagram illustrating a change that may be made to a circuit during the physical synthesis of FIG. 2, in accordance with an embodiment of the present disclosure.

In FIG. 4, circuit 401 includes latch 402. In FIG. 5, circuit 401 has been changed from FIG. 4 by moving latch 402. In FIG. 6, circuit 401 has been changed from FIG. 5 by the insertion of buffer 403. In FIG. 7, circuit 401 has been changed from FIG. 6 by the removal of buffer 403. Buffer 403 may have been removed from circuit 401 because a comparison of a timing query of circuit 401 as illustrated in FIG. 6 revealed it was not an improvement over circuit 401 as illustrated in FIG. 5. Also in FIG. 7, circuit 401 has also been changed from FIG. 6 by the resizing of latch 402 (replacing latch 402 with larger latch 402) and. In FIG. 8, circuit 401 has been changed from FIG. 7 by the insertion of buffer 405.

As will be appreciated by one skilled in the art, the present disclosure may be embodied as a system, method or computer program product. Accordingly, the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present disclosure may take the form of a computer program product embodied in any tangible medium of expression having computer-usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present disclosure is described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 9:
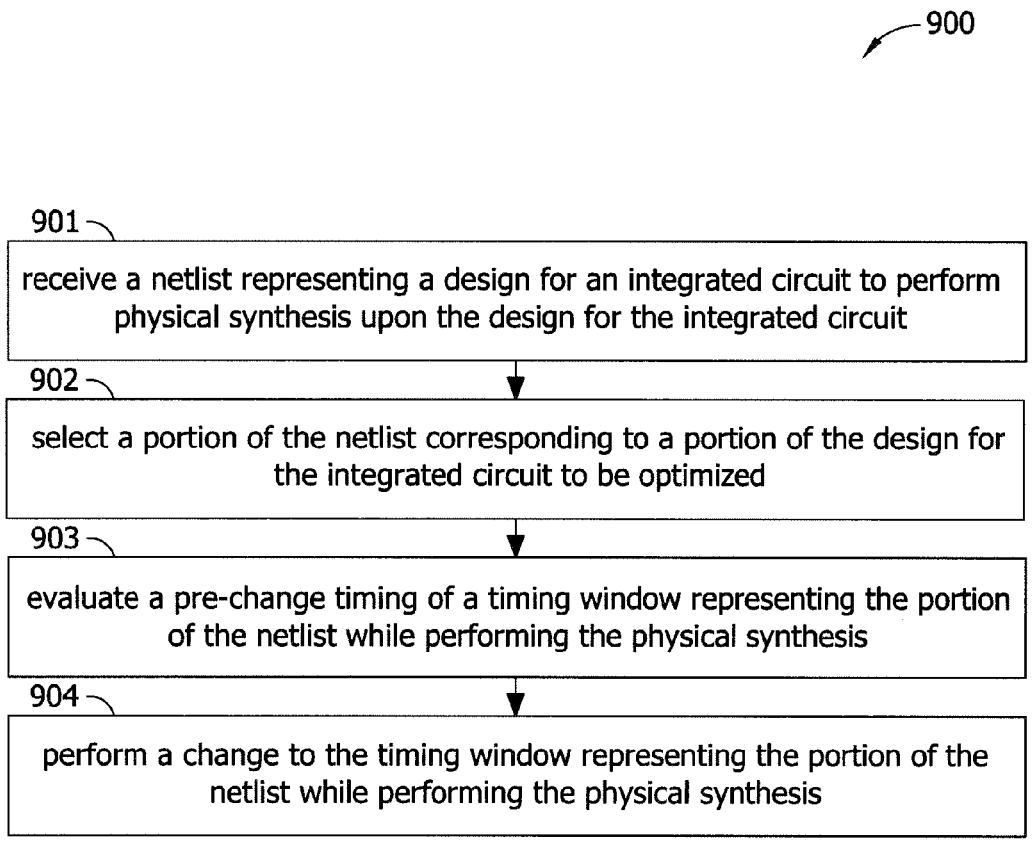
FIG. 9 is a flow diagram illustrating a method of physical synthesis of an integrated circuit design represented by a gate-level netlist, in accordance with an alternative embodiment of the present disclosure.

FIG. 9 illustrates a method of physical synthesis of an integrated circuit design represented by a gate-level netlist, in accordance with an alternative embodiment of the present disclosure. In step 901, receive a netlist representing a design for an integrated circuit to perform physical synthesis upon the design for the integrated circuit. In step 902, select a portion of the netlist corresponding to a portion of the design for the integrated circuit to be optimized. In step 903, evaluate a pre-change timing of a timing window representing the portion of the netlist while performing the physical synthesis. In step 904, perform a change to the timing window representing the portion of the netlist while performing the physical synthesis.

Figure 10:
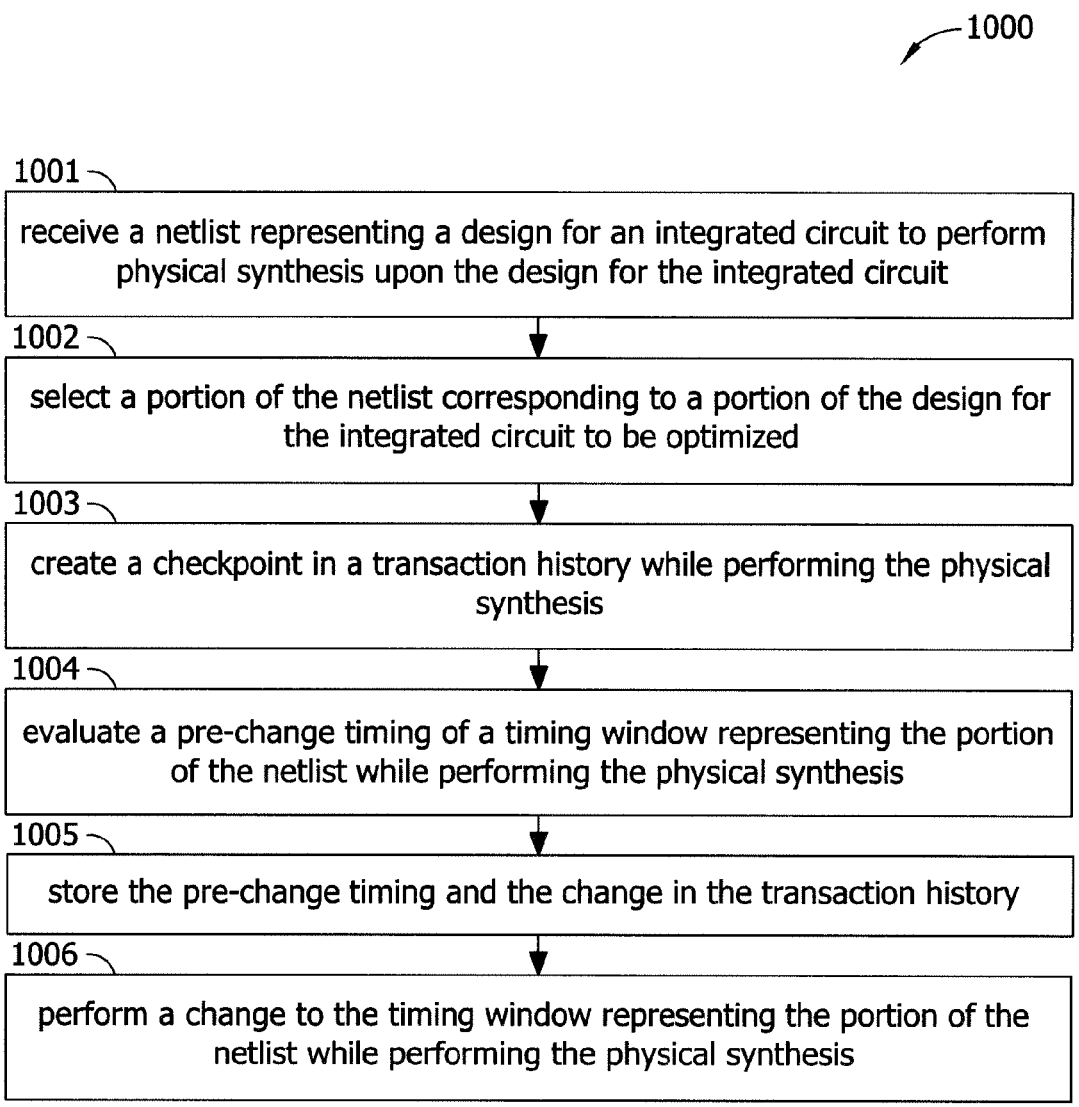
FIG. 10 is a flow diagram illustrating a method of physical synthesis of an integrated circuit design represented by a gate-level netlist, in accordance with an alternative embodiment of the present disclosure.

FIG. 10 illustrates a method of physical synthesis of an integrated circuit design represented by a gate-level netlist, in accordance with an alternative embodiment of the present disclosure. In step 1001, receive a netlist representing a design for an integrated circuit to perform physical synthesis upon the design for the integrated circuit. In step 1002, select a portion of the netlist corresponding to a portion of the design for the integrated circuit to be optimized. In step 1003, create a checkpoint in a transaction history while performing the physical synthesis. In step 1004, evaluate a pre-change timing of a timing window representing the portion of the netlist while performing the physical synthesis. In step 1005, store the pre-change timing and the change in the transaction history. In step 1006, perform a change to the timing window representing the portion of the netlist while performing the physical synthesis.

Figure 11:
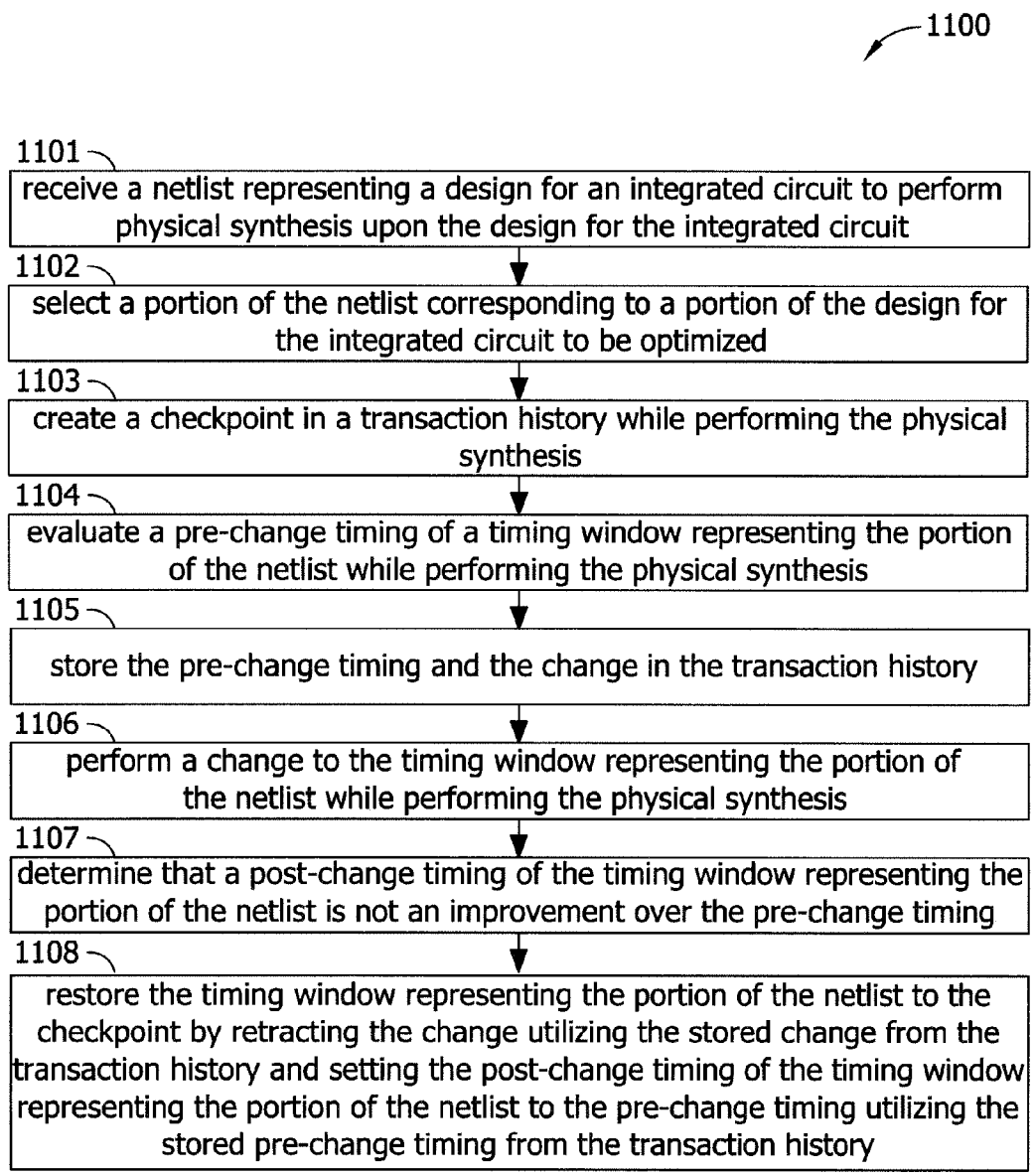
FIG. 11 is a flow diagram illustrating a method of physical synthesis of an integrated circuit design represented by a gate-level netlist, in accordance with an alternative embodiment of the present disclosure.

FIG. 11 illustrates a method of physical synthesis of an integrated circuit design represented by a gate-level netlist, in accordance with an alternative embodiment of the present disclosure. In step 1101, receive a netlist representing a design for an integrated circuit to perform physical synthesis upon the design for the integrated circuit. In step 1102, select a portion of the netlist corresponding to a portion of the design for the integrated circuit to be optimized. In step 1103, create a checkpoint in a transaction history while performing the physical synthesis. In step 1104, evaluate a pre-change timing of a timing window representing the portion of the netlist while performing the physical synthesis. In step 1105, store the pre-change timing and the change in the transaction history. In step 1106, perform a change to the timing window representing the portion of the netlist while performing the physical synthesis. In step 1107, determine that a post-change timing of the timing window representing the portion of the netlist is not an improvement over the pre-change timing. In step 1108, restore the timing window representing the portion of the netlist to the checkpoint by retracting the change utilizing the stored change from the transaction history and setting the post-change timing of the timing window representing the portion of the netlist to the pre-change timing utilizing the stored pre-change timing from the transaction history.

Figure 12:
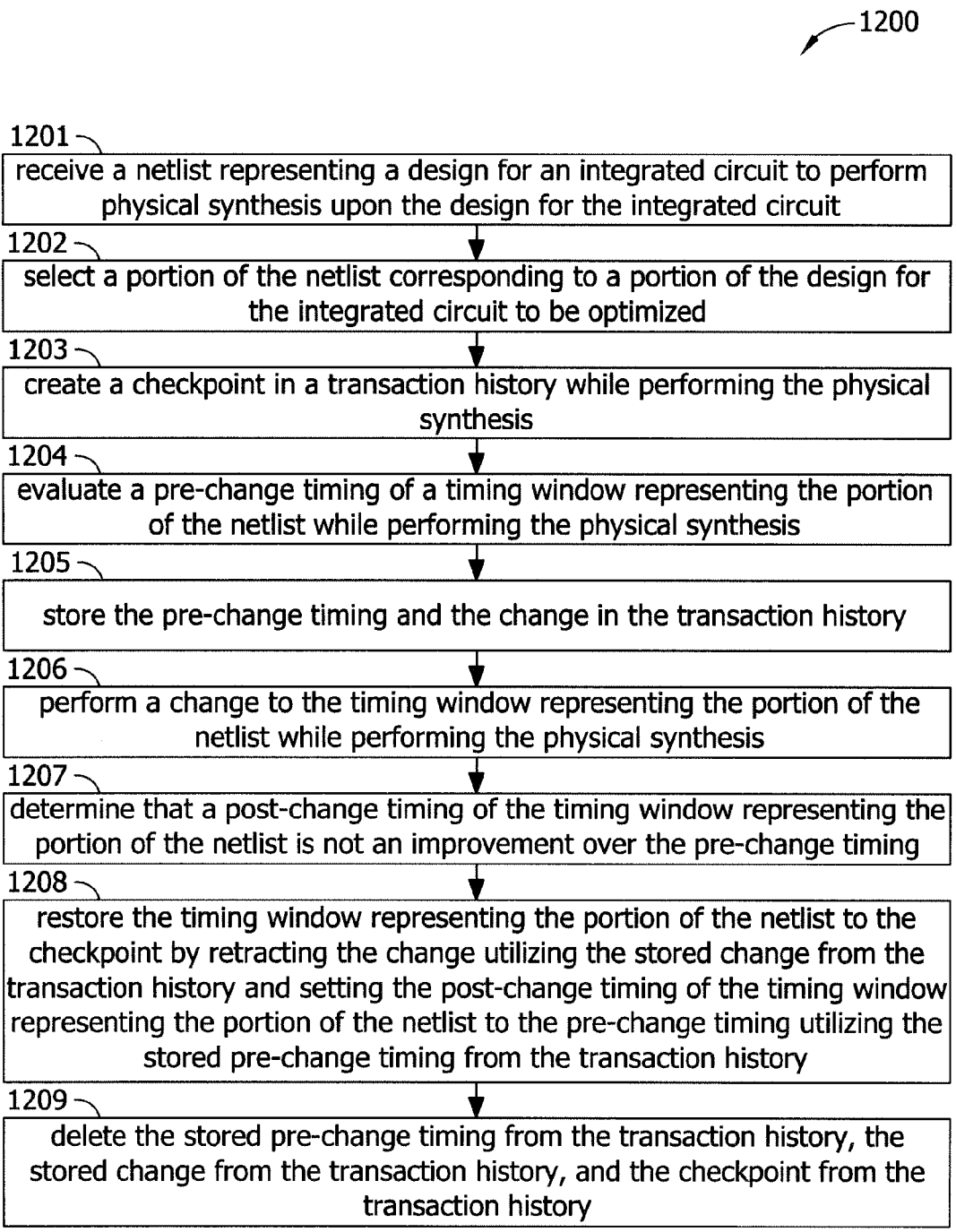
FIG. 12 is a flow diagram illustrating a method of physical synthesis of an integrated circuit design represented by a gate-level netlist, in accordance with an alternative embodiment of the present disclosure.

FIG. 12 illustrates a method of physical synthesis of an integrated circuit design represented by a gate-level netlist, in accordance with an alternative embodiment of the present disclosure. In step 1201, receive a netlist representing a design for an integrated circuit to perform physical synthesis upon the design for the integrated circuit. In step 1202, select a portion of the netlist corresponding to a portion of the design for the integrated circuit to be optimized. In step 1203, create a checkpoint in a transaction history while performing the physical synthesis. In step 1204, evaluate a pre-change timing of a timing window representing the portion of the netlist while performing the physical synthesis. In step 1205, store the pre-change timing and the change in the transaction history. In step 1206, perform a change to the timing window representing the portion of the netlist while performing the physical synthesis. In step 1207, determine that a post-change timing of the timing window representing the portion of the netlist is not an improvement over the pre-change timing. In step 1208 restore the timing window representing the portion of the netlist to the checkpoint by retracting the change utilizing the stored change from the transaction history and setting the post-change timing of the timing window representing the portion of the netlist to the pre-change timing utilizing the stored pre-change timing from the transaction history. In step 1209, delete the stored pre-change timing from the transaction history, the stored change from the transaction history, and the checkpoint from the transaction history.

Figure 13:
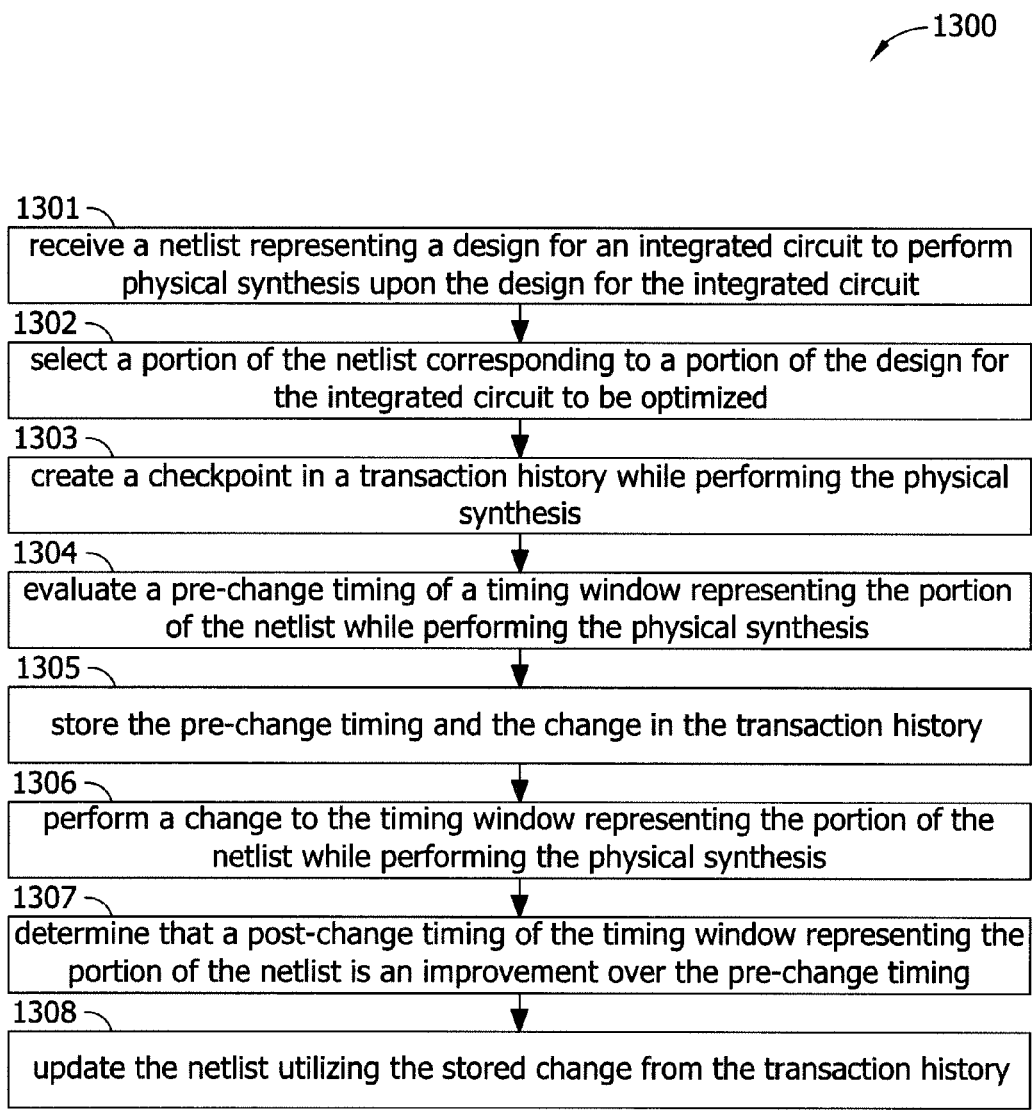
FIG. 13 is a flow diagram illustrating a method of physical synthesis of an integrated circuit design represented by a gate-level netlist, in accordance with an alternative embodiment of the present disclosure.

FIG. 13 illustrates a method of physical synthesis of an integrated circuit design represented by a gate-level netlist, in accordance with an alternative embodiment of the present disclosure. In step 1301, receive a netlist representing a design for an integrated circuit to perform physical synthesis upon the design for the integrated circuit. In step 1302, select a portion of the netlist corresponding to a portion of the design for the integrated circuit to be optimized. In step 1303, create a checkpoint in a transaction history while performing the physical synthesis. In step 1304, evaluate a pre-change timing of a timing window representing the portion of the netlist while performing the physical synthesis. In step 1305, store the pre-change timing and the change in the transaction history. In step 1306, perform a change to the timing window representing the portion of the netlist while performing the physical synthesis. In step 1307, determine that a post-change timing of the timing window representing the portion of the netlist is an improvement over the pre-change timing. In step 1308, update the netlist utilizing the stored change from the transaction history.

Figure 14:
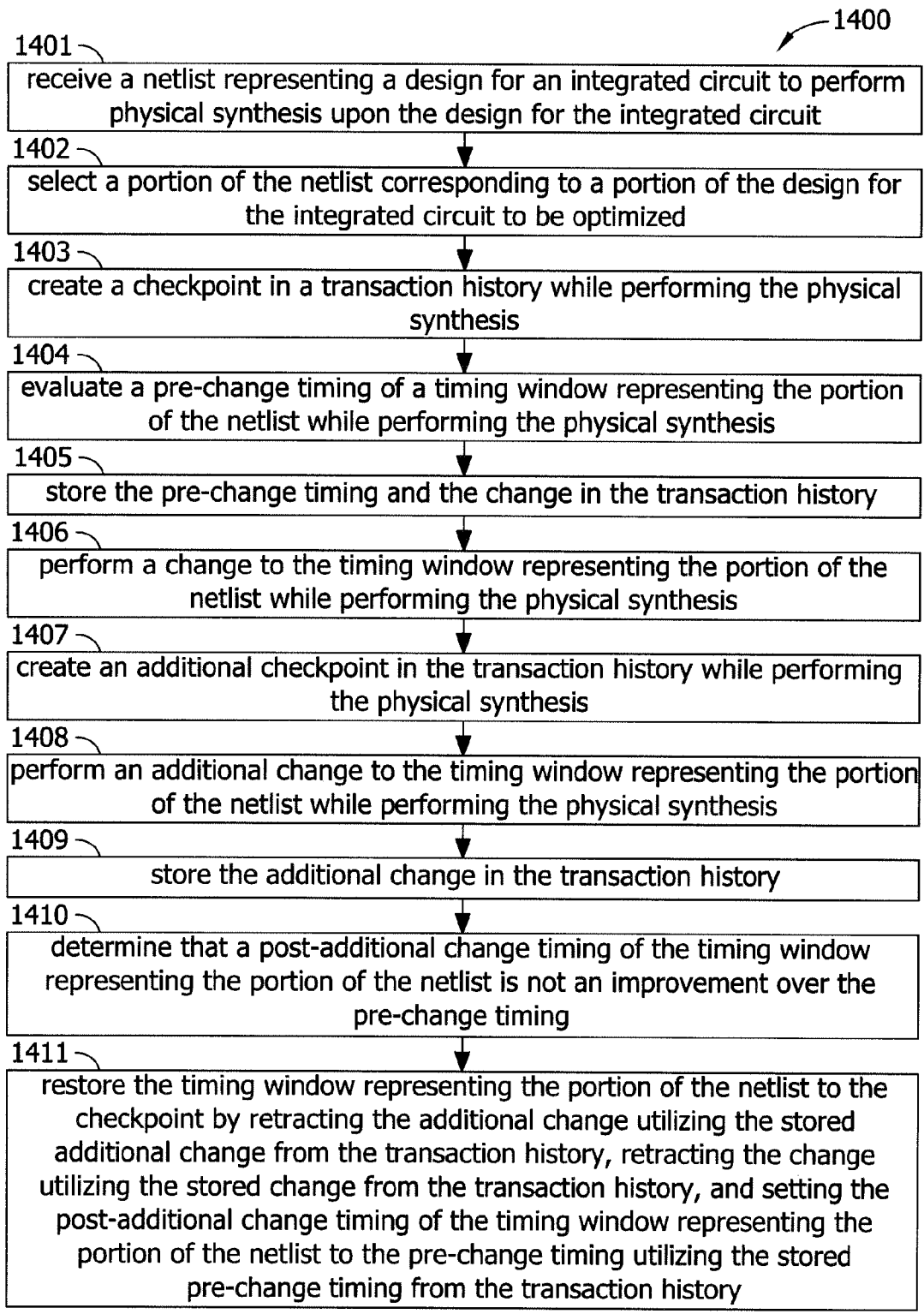
FIG. 14 is a flow diagram illustrating a method of physical synthesis of an integrated circuit design represented by a gate-level netlist, in accordance with an alternative embodiment of the present disclosure.

FIG. 14 illustrates a method of physical synthesis of an integrated circuit design represented by a gate-level netlist, in accordance with an alternative embodiment of the present disclosure. In step 1401, receive a netlist representing a design for an integrated circuit to perform physical synthesis upon the design for the integrated circuit. In step 1402, select a portion of the netlist corresponding to a portion of the design for the integrated circuit to be optimized. In step 1403, create a checkpoint in a transaction history while performing the physical synthesis. In step 1404, evaluate a pre-change timing of a timing window representing the portion of the netlist while performing the physical synthesis. In step 1405, store the pre-change timing and the change in the transaction history. In step 1406, perform a change to the timing window representing the portion of the netlist while performing the physical synthesis. In step 1407, create an additional checkpoint in the transaction history while performing the physical synthesis. In step 1408, perform an additional change to the timing window representing the portion of the netlist while performing the physical synthesis. In step 1409, store the additional change in the transaction history. In step 1410, determine that a post-additional change timing of the timing window representing the portion of the netlist is not an improvement over the pre-change timing. In step 1411, restore the timing window representing the portion of the netlist to the checkpoint by retracting the additional change utilizing the stored additional change from the transaction history, retracting the change utilizing the stored change from the transaction history, and setting the post-additional change timing of the timing window representing the portion of the netlist to the pre-change timing utilizing the stored pre-change timing from the transaction history.

Figure 15:
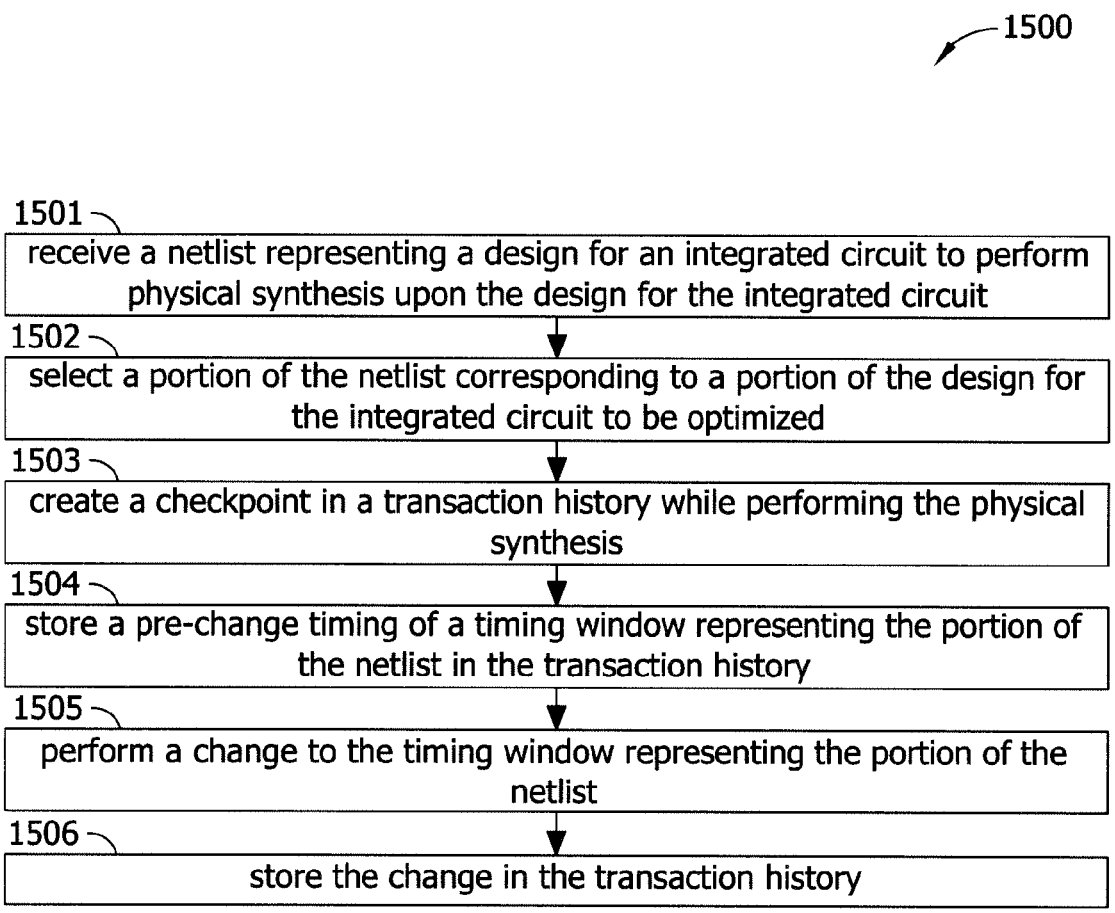
FIG. 15 is a flow diagram illustrating a method of physical synthesis of an integrated circuit design represented by a gate-level netlist, in accordance with an alternative embodiment of the present disclosure.

FIG. 15 illustrates a method of physical synthesis of an integrated circuit design represented by a gate-level netlist, in accordance with an alternative embodiment of the present disclosure. In step 1501, receive a netlist representing a design for an integrated circuit to perform physical synthesis upon the design for the integrated circuit. In step 1502, select a portion of the netlist corresponding to a portion of the design for the integrated circuit to be optimized. In step 1503, create a checkpoint in a transaction history while performing the physical synthesis. In step 1504, store a pre-change timing of a timing window representing the portion of the netlist in the transaction history. In step 1505, perform a change to the timing window representing the portion of the netlist. In step 1506, store the change in the transaction history.

Figure 16:
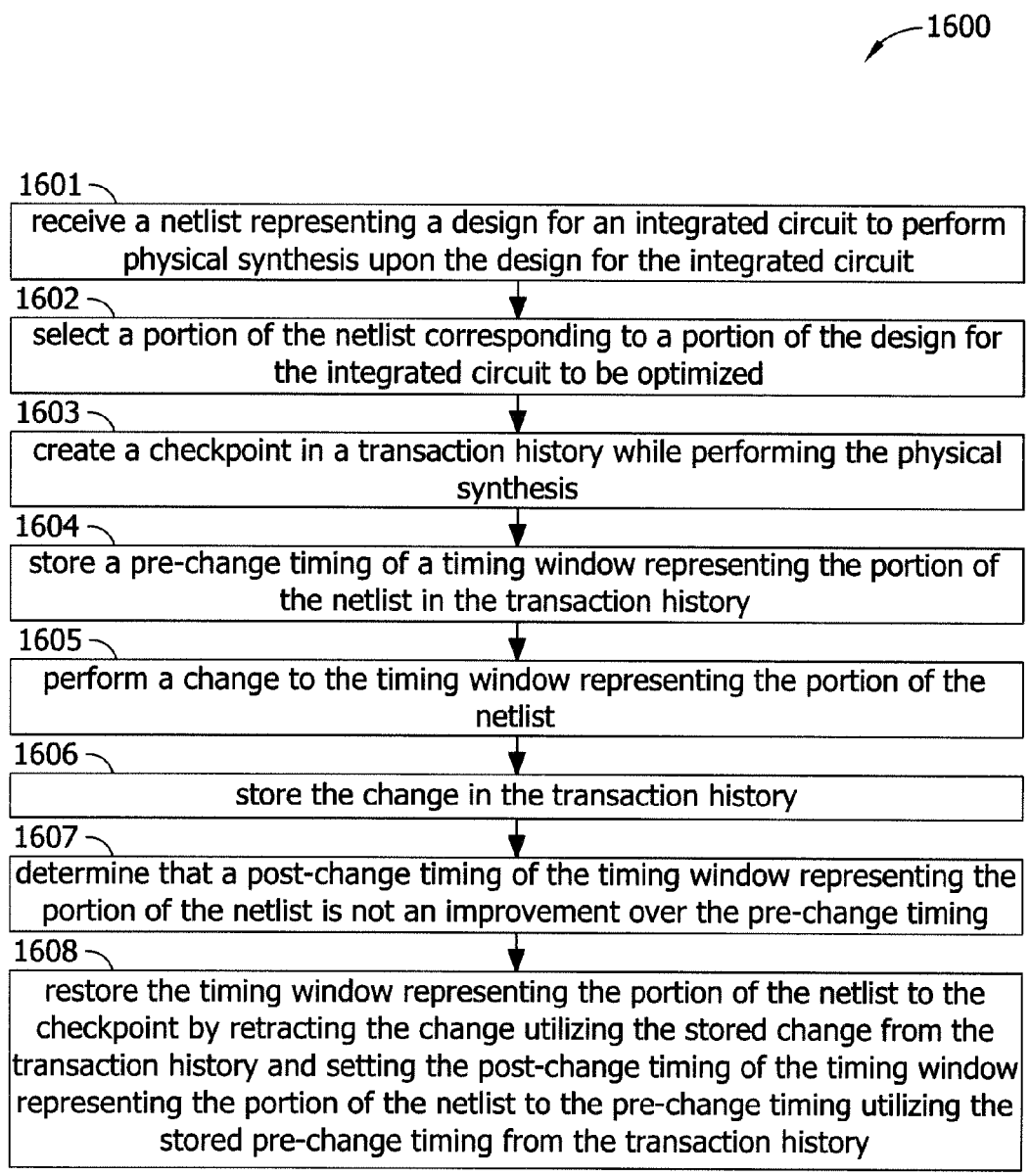
FIG. 16 is a flow diagram illustrating a method of physical synthesis of an integrated circuit design represented by a gate-level netlist, in accordance with an alternative embodiment of the present disclosure.

FIG. 16 illustrates a method of physical synthesis of an integrated circuit design represented by a gate-level netlist, in accordance with an alternative embodiment of the present disclosure. In step 1601, receive a netlist representing a design for an integrated circuit to perform physical synthesis upon the design for the integrated circuit. In step 1602, select a portion of the netlist corresponding to a portion of the design for the integrated circuit to be optimized. In step 1603, create a checkpoint in a transaction history while performing the physical synthesis. In step 1604, store a pre-change timing of a timing window representing the portion of the netlist in the transaction history. In step 1605, perform a change to the timing window representing the portion of the netlist. In step 1606, store the change in the transaction history. In step 1607, determine that a post-change timing of the timing window representing the portion of the netlist is not an improvement over the pre-change timing. In step 1608, restore the timing window representing the portion of the netlist to the checkpoint by retracting the change utilizing the stored change from the transaction history and setting the post-change timing of the timing window representing the portion of the netlist to the pre-change timing utilizing the stored pre-change timing from the transaction history.

Figure 17:
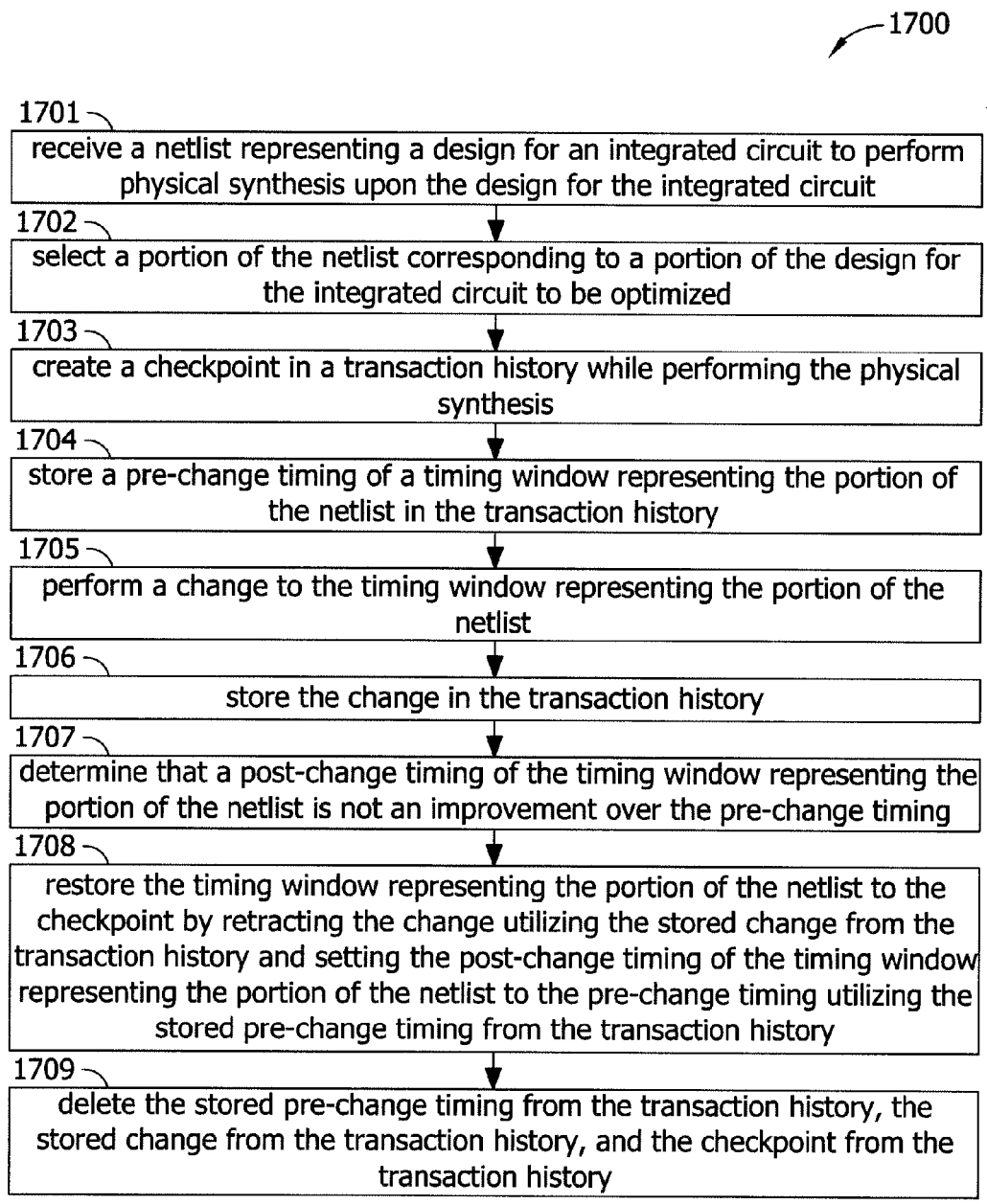
FIG. 17 is a flow diagram illustrating a method of physical synthesis of an integrated circuit design represented by a gate-level netlist, in accordance with an alternative embodiment of the present disclosure.

FIG. 17 illustrates a method of physical synthesis of an integrated circuit design represented by a gate-level netlist, in accordance with an alternative embodiment of the present disclosure. In step 1701, receive a netlist representing a design for an integrated circuit to perform physical synthesis upon the design for the integrated circuit. In step 1702, select a portion of the netlist corresponding to a portion of the design for the integrated circuit to be optimized. In step 1703, create a checkpoint in a transaction history while performing the physical synthesis. In step 1704, store a pre-change timing of a timing window representing the portion of the netlist in the transaction history. In step 1705, perform a change to the timing window representing the portion of the netlist. In step 1706, store the change in the transaction history. In step 1707, determine that a post-change timing of the timing window representing the portion of the netlist is not an improvement over the pre-change timing. In step 1708, restore the timing window representing the portion of the netlist to the checkpoint by retracting the change utilizing the stored change from the transaction history and setting the post-change timing of the timing window representing the portion of the netlist to the pre-change timing utilizing the stored pre-change timing from the transaction history. In step 1709, delete the stored pre-change timing from the transaction history, the stored change from the transaction history, and the checkpoint from the transaction history.

Figure 18:
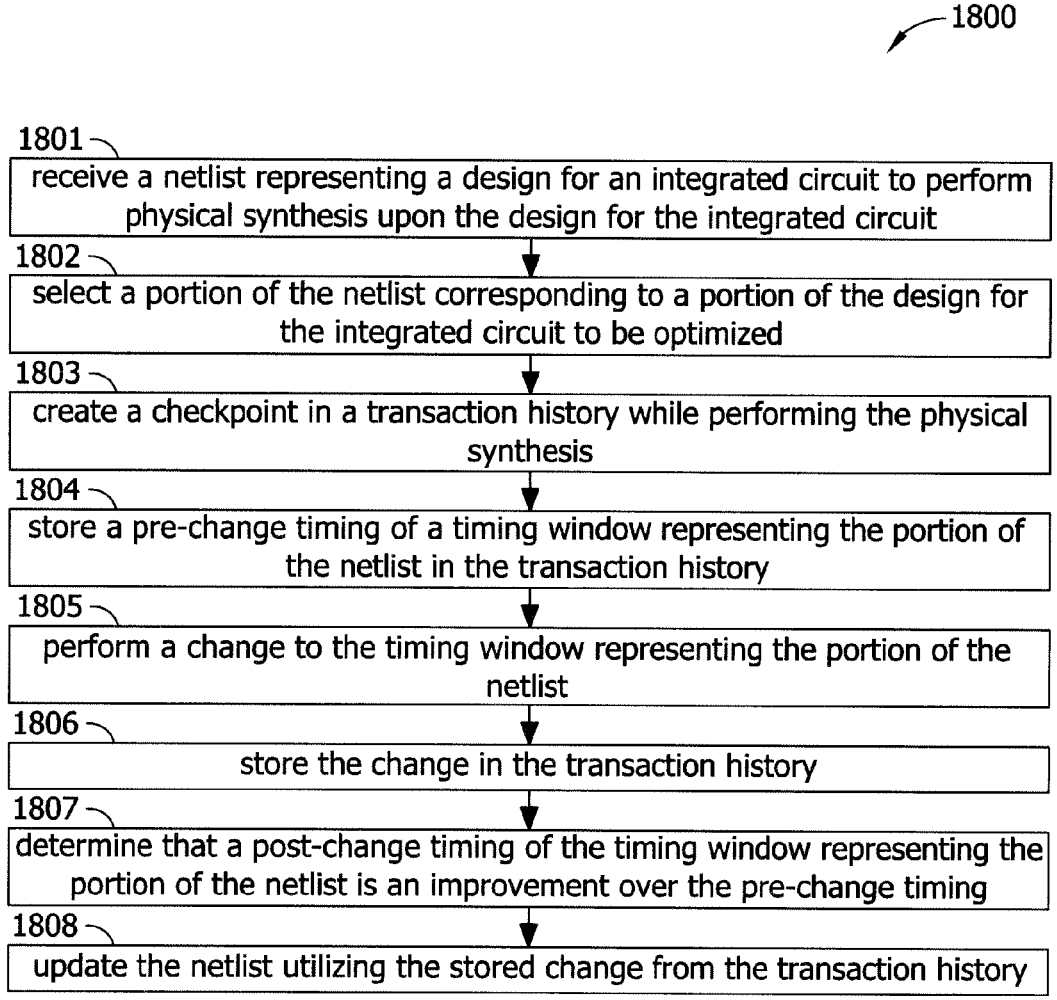
FIG. 18 is a flow diagram illustrating a method of physical synthesis of an integrated circuit design represented by a gate-level netlist, in accordance with an alternative embodiment of the present disclosure.

FIG. 18 illustrates a method of physical synthesis of an integrated circuit design represented by a gate-level netlist, in accordance with an alternative embodiment of the present disclosure. In step 1801, receive a netlist representing a design for an integrated circuit to perform physical synthesis upon the design for the integrated circuit. In step 1802, select a portion of the netlist corresponding to a portion of the design for the integrated circuit to be optimized. In step 1803, create a checkpoint in a transaction history while performing the physical synthesis. In step 1804, store a pre-change timing of a timing window representing the portion of the netlist in the transaction history. In step 1805, perform a change to the timing window representing the portion of the netlist. In step 1806, store the change in the transaction history. In step 1807, determine that a post-change timing of the timing window representing the portion of the netlist is an improvement over the pre-change timing. In step 1808, update the netlist utilizing the stored change from the transaction history.

Figure 19:
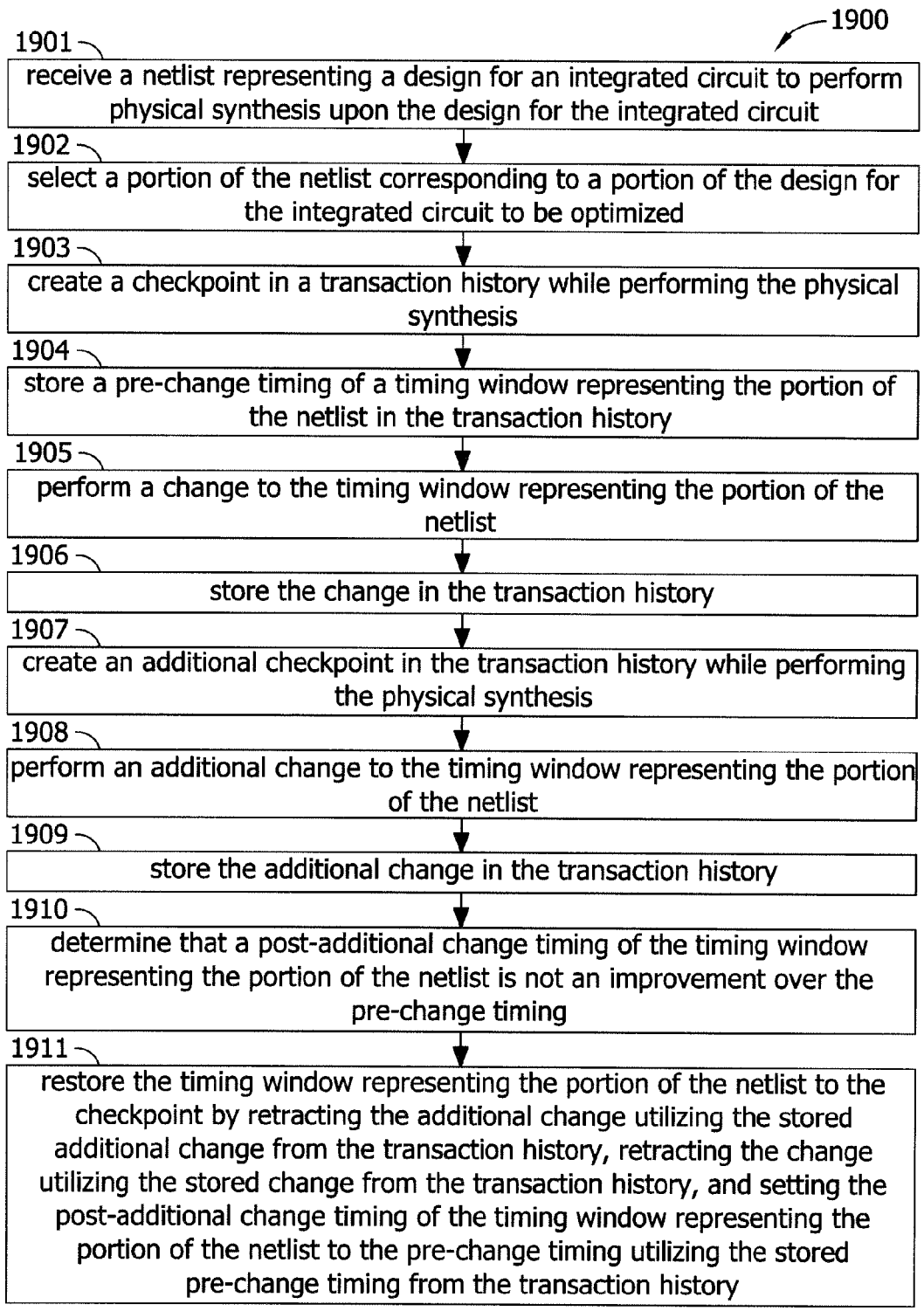
FIG. 19 is a flow diagram illustrating a method of physical synthesis of an integrated circuit design represented by a gate-level netlist, in accordance with an alternative embodiment of the present disclosure.

FIG. 19 illustrates a method of physical synthesis of an integrated circuit design represented by a gate-level netlist, in accordance with an alternative embodiment of the present disclosure. In step 1901, receive a netlist representing a design for an integrated circuit to perform physical synthesis upon the design for the integrated circuit. In step 1902, select a portion of the netlist corresponding to a portion of the design for the integrated circuit to be optimized. In step 1903, create a checkpoint in a transaction history while performing the physical synthesis. In step 1904, store a pre-change timing of a timing window representing the portion of the netlist in the transaction history. In step 1905, perform a change to the timing window representing the portion of the netlist. In step 1906, store the change in the transaction history. In step 1907, create an additional checkpoint in the transaction history while performing the physical synthesis. In step 1908, perform an additional change to the timing window representing the portion of the netlist. In step 1909, store the additional change in the transaction history. In step 1910, determine that a post-additional change timing of the timing window representing the portion of the netlist is not an improvement over the pre-change timing. In step 1911, restore the timing window representing the portion of the netlist to the checkpoint by retracting the additional change utilizing the stored additional change from the transaction history, retracting the change utilizing the stored change from the transaction history, and setting the post-additional change timing of the timing window representing the portion of the netlist to the pre-change timing utilizing the stored pre-change timing from the transaction history.

The flowchart and block diagrams in the Figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In the present disclosure, the methods disclosed may be implemented as sets of instructions or software readable by a device. Further, it is understood that the specific order or hierarchy of steps in the methods disclosed are examples of exemplary approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

What is claimed is:

1. A method, comprising:
using a computer or processor to perform the steps of
receiving a netlist representing a design for an integrated circuit to perform physical synthesis upon the design for the integrated circuit;
selecting a portion of the netlist corresponding to a portion of the design for the integrated circuit to be optimized;
evaluating a pre-change timing of a timing window representing the portion of the netlist while performing the physical synthesis;
performing a change to the timing window representing the portion of the netlist while performing the physical synthesis;
creating a checkpoint in a transaction history while performing the physical synthesis; and
storing the pre-change timing and the change in the transaction history.

2. The method of claim 1, further comprising:
determining that a post-change timing of the timing window representing the portion of the netlist is not an improvement over the pre-change timing; and
restoring the timing window representing the portion of the netlist to the checkpoint by retracting the change utilizing the stored change from the transaction history and setting the post-change timing of the timing window representing the portion of the netlist to the pre-change timing utilizing the stored pre-change timing from the transaction history.

3. The method of claim 2, further comprising:
deleting the stored pre-change timing from the transaction history, the stored change from the transaction history, and the checkpoint from the transaction history.

4. The method of claim 1, further comprising:
determining that a post-change timing of the timing window representing the portion of the netlist is an improvement over the pre-change timing; and
updating the netlist utilizing the stored change from the transaction history.

5. The method of claim 1, further comprising:
creating an additional checkpoint in the transaction history while performing the physical synthesis;
performing an additional change to the timing window representing the portion of the netlist while performing the physical synthesis;
storing the additional change in the transaction history;
determining that a post-additional change timing of the timing window representing the portion of the netlist is not an improvement over the pre-change timing; and
restoring the timing window representing the portion of the netlist to the checkpoint by retracting the additional change utilizing the stored additional change from the transaction history, retracting the change utilizing the stored change from the transaction history, and setting the post-additional change timing of the timing window representing the portion of the netlist to the pre-change timing utilizing the stored pre-change timing from the transaction history.

6. A method, comprising:
using a computer or processor to perform the steps of
receiving a netlist representing a design for an integrated circuit to perform physical synthesis upon the design for the integrated circuit;
selecting a portion of the netlist corresponding to a portion of the design for the integrated circuit to be optimized;
creating a checkpoint in a transaction history while performing the physical synthesis;
storing a pre-change timing of a timing window representing the portion of the netlist in the transaction history;
performing a change to the timing window representing the portion of the netlist;
storing the change in the transaction history;
determining that a post-change timing of the timing window representing the portion of the netlist is not an improvement over the pre-change timing; and
restoring the timing window representing the portion of the netlist to the checkpoint by retracting the change utilizing the stored change from the transaction history and setting the post-change timing of the timing window representing the portion of the netlist to the pre-change timing utilizing the stored pre-change timing from the transaction history.

7. The method of claim 6, further comprising:
deleting the stored pre-change timing from the transaction history, the stored change from the transaction history, and the checkpoint from the transaction history.

8. The method of claim 6, further comprising:
- determining that a post-change timing of the timing window representing the portion of the netlist is an improvement over the pre-change timing; and
- updating the netlist utilizing the stored change from the transaction history.

9. The method of claim 6, further comprising:
- creating an additional checkpoint in the transaction history while performing the physical synthesis;
- performing an additional change to the timing window representing the portion of the netlist;
- storing the additional change in the transaction history;
- determining that a post-additional change timing of the timing window representing the portion of the netlist is not an improvement over the pre-change timing;
- restoring the timing window representing the portion of the netlist to the checkpoint by retracting the additional change utilizing the stored additional change from the transaction history, retracting the change utilizing the stored change from the transaction history, and setting the post-additional change timing of the timing window representing the portion of the netlist to the pre-change timing utilizing the stored pre-change timing from the transaction history.

10. A computer program product for bounded transactional timing analysis, the computer program product comprising:
- a tangible computer usable storage medium having computer usable code tangibly embodied therewith, the computer usable program code comprising:
- computer usable program code configured to receive a netlist representing a design for an integrated circuit to perform physical synthesis upon the design for the integrated circuit;
- computer usable program code configured to select a portion of the netlist corresponding to a portion of the design for the integrated circuit to be optimized;
- computer usable program code configured to evaluate a pre-change timing of a timing window representing the portion of the netlist while performing the physical synthesis;
- computer usable program code configured to perform a change to the timing window representing the portion of the netlist while performing the physical synthesis;
- computer usable program code configured to create a checkpoint in a transaction history while performing the physical synthesis;
- computer usable program code configured to store the pre-change timing of the change in the transaction history;
- computer usable program code configured to determine that a post-change timing of the timing window representing the portion of the netlist is not an improvement over the pre-change timing; and
- computer usable program code configured to restore the timing window representing the portion of the netlist to the checkpoint by retracting the change utilizing the stored change from the transaction history and setting the post-change timing of the timing window representing the portion of the netlist to the pre-change timing utilizing the stored pre-change timing from the transaction history.

11. The computer program product of claim 10, further comprising:
- computer usable program code configured to delete the stored pre-change timing from the transaction history, the stored change from the transaction history, and the checkpoint from the transaction history.

12. The computer program product of claim 10, further comprising:
- computer usable program code configured to determine that a post-change timing of the timing window representing the portion of the netlist is an improvement over the pre-change timing; and
- computer usable program code configured to update the netlist utilizing the stored change from the transaction history.

13. The computer program product of claim 10, further comprising:
- computer usable program code configured to create an additional checkpoint in the transaction history while performing the physical synthesis;
- computer usable program code configured to perform an additional change to the timing window representing the portion of the netlist while performing the physical synthesis;
- computer usable program code configured to store the additional change in the transaction history;
- computer usable program code configured to determine that a post-additional change timing of the timing window representing the portion of the netlist is not an improvement over the pre-change timing;
- computer usable program code configured to restore the timing window representing the portion of the netlist to the checkpoint by retracting the additional change utilizing the stored additional change from the transaction history, retracting the change utilizing the stored change from the transaction history, and setting the post-additional change timing of the timing window representing the portion of the netlist to the pre-change timing utilizing the stored pre-change timing from the transaction history.

14. A computer program product for bounded transactional timing analysis, the computer program product comprising:
- a tangible computer usable storage medium having computer usable code tangibly embodied therewith, the computer usable program code comprising:
- computer usable program code configured to receive a netlist representing a design for an integrated circuit to perform physical synthesis upon the design for the integrated circuit;
- computer usable program code configured to select a portion of the netlist corresponding to a portion of the design for the integrated circuit to be optimized;
- computer usable program code configured to create a checkpoint in a transaction history while performing the physical synthesis;
- computer usable program code configured to store a pre-change timing of a timing window representing the portion of the netlist in the transaction history;
- computer usable program code configured to perform a change to the timing window representing the portion of the netlist;
- computer usable program code configured to store the change in the transaction history;
- computer usable program code configured to determine that a post-change timing of the timing window representing the portion of the netlist is not an improvement over the pre-change timing; and
- computer usable program code configured to restore the timing window representing the portion of the netlist to the checkpoint by retracting the change utilizing the stored change from the transaction history and setting the post-change timing of the timing window representing the portion of the netlist to the pre-change timing utilizing the stored pre-change timing from the transaction history.

15. The computer program product of claim 14, further comprising:
   computer usable program code configured to delete the stored pre-change timing from the transaction history, the stored change from the transaction history, and the checkpoint from the transaction history.

16. The computer program product of claim 14, further comprising:
   computer usable program code configured to determine that a post-change timing of the timing window representing the portion of the netlist is an improvement over the pre-change timing; and
   computer usable program code configured to update the netlist utilizing the stored change from the transaction history.

17. The computer program product of claim 14, further comprising:
   computer usable program code configured to create an additional checkpoint in the transaction history while performing the physical synthesis;
   computer usable program code configured to perform an additional change to the timing window representing the portion of the netlist;
   computer usable program code configured to store the additional change in the transaction history;
   computer usable program code configured to determine that a post-additional change timing of the timing window representing the portion of the netlist is not an improvement over the pre-change timing;
   computer usable program code configured to restore the timing window representing the portion of the netlist to the checkpoint by retracting the additional change utilizing the stored additional change from the transaction history, retracting the change utilizing the stored change from the transaction history, and setting the post-additional change timing of the timing window representing the portion of the netlist to the pre-change timing utilizing the stored pre-change timing from the transaction history.

* * * * *